(12) United States Patent
Epstein

(10) Patent No.: US 7,637,639 B2
(45) Date of Patent: Dec. 29, 2009

(54) LED EMITTER WITH RADIAL PRISMATIC LIGHT DIVERTER

(75) Inventor: Kenneth A. Epstein, St. Paul, MN (US)

(73) Assignee: 3M Innovative Properties Company, Saint Paul, MN (US)

( * ) Notice: Subject to any disclaimer, the term of this patent is extended or adjusted under 35 U.S.C. 154(b) by 44 days.

(21) Appl. No.: 11/275,288

(22) Filed: Dec. 21, 2005

(65) Prior Publication Data
US 2007/0139798 A1    Jun. 21, 2007

(51) Int. Cl.
*F21V 3/00* (2006.01)

(52) U.S. Cl. .......... 362/311; 362/27; 362/600; 362/606; 362/308; 362/339

(58) Field of Classification Search .......... 362/311, 362/27, 600, 606, 607, 308, 339, 610, 618, 362/620, 622, 623, 626; 349/65; 257/98, 257/99; 353/81, 98, 99
See application file for complete search history.

(56) References Cited

U.S. PATENT DOCUMENTS

| | | | | |
|---|---|---|---|---|
| 1,420,977 | A * | 6/1922 | Dorey | 362/309 |
| 2,538,638 | A | 1/1951 | Wilson | |
| 3,330,951 | A * | 7/1967 | Neal | 362/309 |
| 3,646,338 | A * | 2/1972 | Goytisolo | 362/294 |
| 4,615,579 | A | 10/1986 | Whitehead | |
| 4,791,540 | A | 12/1988 | Dreyer, Jr. et al. | |
| 4,805,984 | A | 2/1989 | Cobb, Jr. | |
| 4,906,070 | A | 3/1990 | Cobb, Jr. | |
| 4,938,563 | A | 7/1990 | Nelson et al. | |
| 5,182,663 | A | 1/1993 | Jones | |
| 5,523,889 | A * | 6/1996 | Bewsher | 359/710 |
| 5,711,588 | A | 1/1998 | Rudisill | |
| 6,355,946 | B1 | 3/2002 | Ishinaga | |
| 6,357,888 | B1 * | 3/2002 | Takata et al. | 362/620 |
| 6,473,554 | B1 | 10/2002 | Pelka et al. | |
| 6,488,392 | B1 * | 12/2002 | Lu | 362/308 |
| 6,547,423 | B2 | 4/2003 | Marshall et al. | |
| 6,582,103 | B1 | 6/2003 | Popovich et al. | |
| 6,598,998 | B2 | 7/2003 | West et al. | |
| 6,647,199 | B1 | 11/2003 | Pelka et al. | |
| 6,669,350 | B2 * | 12/2003 | Yamashita et al. | 362/612 |
| 6,679,621 | B2 | 1/2004 | West et al. | |

(Continued)

FOREIGN PATENT DOCUMENTS

KR    10-2002-0080834    10/2002

(Continued)

OTHER PUBLICATIONS

U.S. Application entitled "LED Light Confinement Element", filed Dec. 21, 2005, having U.S. Appl. No. 11/275,289.

*Primary Examiner*—Sandra L O'Shea
*Assistant Examiner*—Mark Tsidulko
(74) *Attorney, Agent, or Firm*—Lance L. Vietzke

(57) ABSTRACT

An optical assembly includes a light emitting diode (LED) and a structured surface. The structured surface has a plurality of prismatic structures arranged radially with respect to a reference point, and is disposed relative to the LED such that the reference point is substantially aligned with a light emission axis of the LED. Arrays of such assemblies and backlights and displays including same are also disclosed.

20 Claims, 5 Drawing Sheets

U.S. PATENT DOCUMENTS

| | | |
|---|---|---|
| 6,971,748 B2 * | 12/2005 | Cho et al. .................... 353/46 |
| 2003/0128957 A1 * | 7/2003 | Kalantar .................... 385/146 |
| 2004/0105157 A1 * | 6/2004 | Matsushita et al. ......... 359/584 |
| 2004/0223315 A1 | 11/2004 | Suehiro et al. |
| 2005/0195341 A1 | 9/2005 | Koganezawa et al. |
| 2005/0264716 A1 | 12/2005 | Kim et al. |
| 2006/0050200 A1 * | 3/2006 | Nagao ....................... 349/65 |
| 2006/0081863 A1 | 4/2006 | Kim et al. |
| 2007/0014018 A1 * | 1/2007 | Wheatley et al. ........... 359/580 |

FOREIGN PATENT DOCUMENTS

| | | |
|---|---|---|
| KR | 10-2005-0096510 | 10/2005 |
| WO | WO 2006/020535 | 2/2006 |

* cited by examiner

LED EMITTER WITH RADIAL PRISMATIC LIGHT DIVERTER

BACKGROUND

The present disclosure relates to LED light sources, particularly to such sources that include encapsulants, lenses, films, and the like that are shaped or otherwise configured to redirect light propagating initially along a light emitting axis into other directions. The resulting optical assembly is particularly useful, whether singly or in an array, in flat illumination sources (e.g., room lights), in backlights for liquid crystal display (LCD) devices and the like, such as TVs, computer monitors, personal digital assistants (PDAs), mobile telephones, and so forth.

SUMMARY

The present application discloses, inter alia, optical assemblies that include an LED and a structured surface. The structured surface includes a plurality of prismatic structures arranged radially with respect to a reference point. Preferably, the reference point is substantially aligned with a light emission axis of the LED. The light emission axis may correspond, for example, to a direction of maximum flux or brightness of the LED, or to an axis of symmetry of the LED or one of its components, such as the LED die or LED encapsulant (if present), or to an axis of symmetry of the light distribution of the LED, or to another selected direction associated with the LED.

In some cases, each of the prismatic structures has a prism apex that is substantially linear. The linear prism apices can all be oriented parallel to a reference plane, e.g., a reference plane perpendicular to the light emission axis of the LED, or the linear prism apices can be inclined in a conical arrangement relative to the light emission axis. In some cases, each of the prismatic structures has a prism apex that is curved. The curved prism apices can, if desired, be inclined in a funnel arrangement relative to the light emission axis. In some cases, the prismatic structures each have a prism apex, and the prism apices substantially intersect at the reference point. In some cases, the prismatic structures each has a prism apex with a first end proximate the reference point, but where the first ends of the prism apices are spaced apart from the reference point. In some cases, the LED includes an LED die disposed within an encapsulant, and the structured surface is disposed on the encapsulant, e.g., formed on an outer surface of the encapsulant or applied as a separate layer such as a film or cap to the encapsulant. In some cases, the optical assembly includes a reflective layer positioned to receive at least some LED light reflected by the structured surface.

Arrays of optical assemblies are also disclosed, wherein an array of LEDs is combined with an array of structured surfaces, each structured surface has a plurality of prismatic structures arranged radially with respect to a reference point. Preferably, the reference point for each structured surface is substantially aligned with a light emission axis of a corresponding LED. The LEDs can be disposed adjacent a reflective layer. If the LEDs each include an LED die disposed within an encapsulant, the structured surfaces can be formed individually on each of the encapsulants. Alternatively, the structured surfaces can be formed in a continuous optical film that extends over some or all of the LEDs in the array.

Backlights and displays incorporating the foregoing optical assemblies and arrays thereof are also disclosed.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWINGS

The disclosure may be more completely understood in consideration of the following detailed description of various embodiments in connection with the accompanying drawings, in which.

Figure 1:
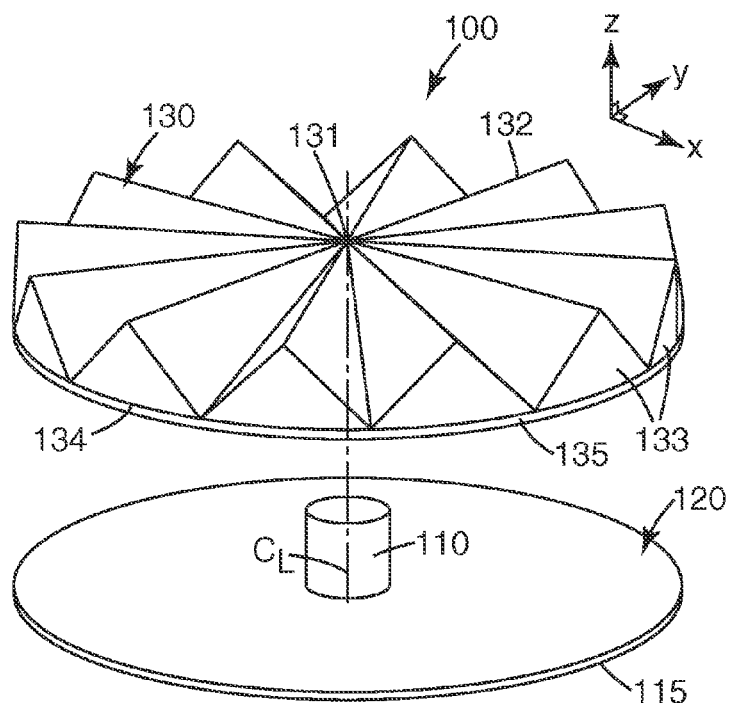
FIG. 1 is a perspective view of an illustrative optical assembly.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present disclosure relates to optical assemblies that include an LED and a structured surface. The structured surface includes a plurality of prismatic structures arranged radially with respect to a reference point.

For the following defined terms, these definitions shall be applied, unless a different definition is given in the claims or elsewhere in this specification.

The recitation of numerical ranges by endpoints includes all numbers subsumed within that range (e.g. 1 to 5 includes 1, 1.5, 2, 2.75, 3, 3.80, 4, and 5).

As used in this specification and the appended claims, the singular forms "a", "an", and "the" include plural referents unless the content clearly dictates otherwise. Thus, for example, reference to a composition containing "a layer" includes of two or more layers. As used in this specification and the appended claims, the term "or" is generally employed in its sense including "and/or" unless the content clearly dictates otherwise.

Unless otherwise indicated, all numbers expressing quantities, measurement of properties and so forth used in the specification and claims are to be understood as being modified in all instances by the term "about." Accordingly, unless indicated to the contrary, the numerical parameters set forth in the specification and claims are approximations that can vary depending upon the desired properties sought to be obtained by those skilled in the art utilizing the teachings of the present invention. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviations found in their respective testing measurements.

The term "LED" is used herein to refer to a diode that emits light, whether visible, ultraviolet, or infrared. It includes incoherent encased or encapsulated semiconductor devices marketed as "LEDs", whether of the conventional or super radiant variety. If the LED emits non-visible light such as ultraviolet light, and in some cases where it emits visible light, it can be packaged to include a phosphor (or it may illuminate a remotely disposed phosphor) to convert short wavelength light to longer wavelength visible light, in some cases yielding a device that emits white light. An "LED die" is an LED in its most basic form, i.e., in the form of an individual component or chip made by semiconductor processing procedures. For example, the LED die is ordinarily formed from a combination of one or more Group III elements and of one or more Group V elements (III-V semiconductor). Examples of suitable III-V semiconductor materials include nitrides, such as gallium nitride, and phosphides, such as indium gallium phosphide. Other types of III-V materials can be used also, as might inorganic materials from other groups of the periodic table. The component or chip can include electrical contacts suitable for application of power to energize the device. Examples include wire bonding, tape automated bonding (TAB), or flip-chip bonding. The individual layers and other functional elements of the component or chip are typically formed on the wafer scale, and the finished wafer can then be diced into individual piece parts to yield a multiplicity of LED dies. The LED die may be configured for surface mount, chip-on-board, or other known mounting configurations. Some packaged LEDs are made by forming a polymer encapsulant formed over an LED die and an associated reflector cup. The LED die has a quasi-Lambertian emission pattern and much of the light generated within the LED die is trapped due to total internal reflection at the die surface or emitted out of the polymer encapsulant directly above the LED die.

Figure 3:
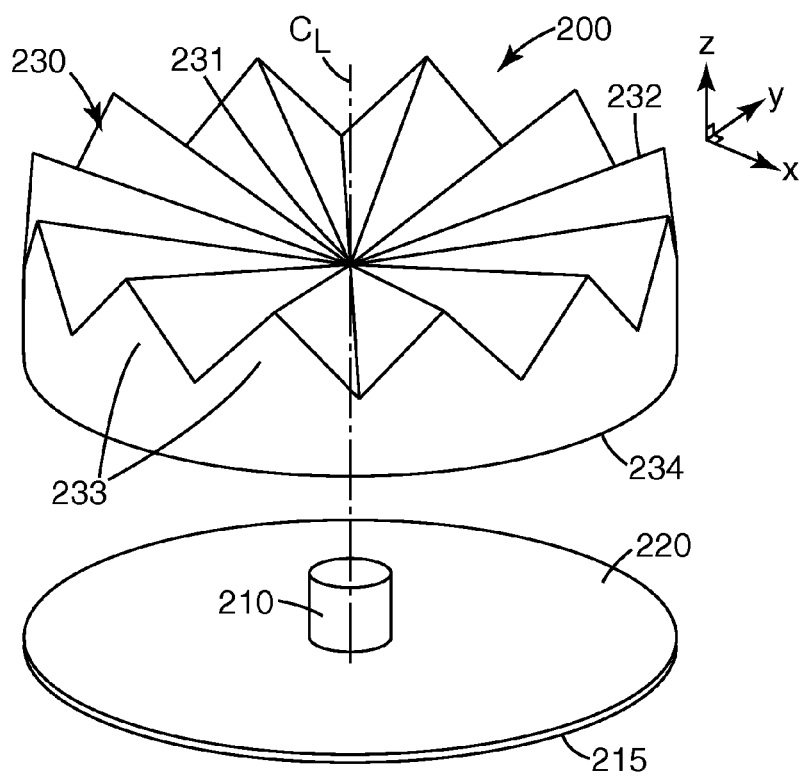
FIG. 3 is a perspective view of another illustrative optical assembly.
Figure 5:
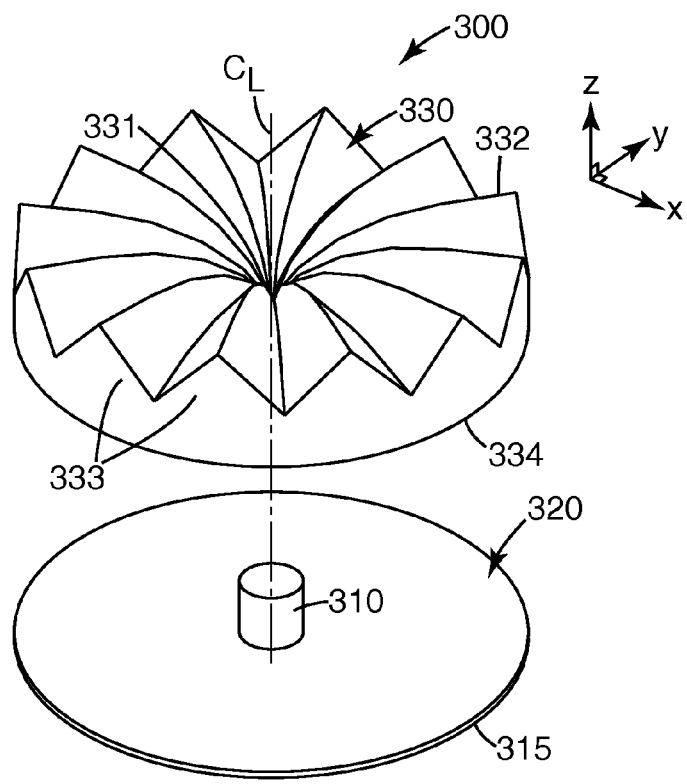
FIG. 5 is a perspective view of another illustrative optical assembly.

FIGS. 1, 3, and 5 depict LEDs schematically, and the reader will understand that any of the above-described types of LEDs are contemplated. Elements in these figures are not necessarily shown to scale and may be closer or further away from one another than is shown in these figures. While each figure shown is an individual structured surface element, it is understood that more than one structured surface elements can be present on a web or film to form a array of structured surface elements, which can then be sub-divided into smaller units, or used as an array, as described below. In addition, one or more layers of material (including air) may be present between the LED and the structured surface element. In some embodiments, the structured surface element is disposed within an encapsulant forming a packaged LED. In further embodiments, the LED is embedded within the structured surface element. In other embodiments, the structured surface elements be formed in a film that is extends over the LEDs as a distinct layer.

In backlight design, it is desirable to receive light from multiple compact sources and to spread out the light across a surface area (e.g., a LCD backlight illuminated directly with CCFL tubes or LEDs. The basic luminaire includes a cavity in which light propagates and reflects and eventually is extracted toward the viewer. Long light paths within the cavity are often desirable to permit adequate spreading such that uniformity is achieved.

One method to extend light paths is to confine light to a polymer lightguide, which may suffer loss if the polymer is absorptive. Alternatively, one can emit light directly within a hollow cavity bounded by a partially transmitting sheet and a fully reflective sheet. In the latter case, the light sources are normally chosen to emit the majority of light into angles close to the plane of the cavity so that light can spread freely with few reflections.

FIG. 1 is a perspective view of an illustrative optical assembly. The optical assembly 100 includes a light emitting diode (LED) 110 having a light emission axis $C_L$ extending along a z-axis, an optional reflective layer 120 situated adjacent the LED 110, and a structured surface element 130 is disposed over the LED 110 and optional reflective layer 120. Structured surface element 130 can optionally be disposed on an encapsulant 135 when LED 110 is disposed within the encapsulant. The structured surface element 130 preferably has an associated reference point 131 disposed along or substantially aligned with the light emission axis $C_L$. The structured surface element 130 has at least two, three or at least four linear prismatic structures 133 arranged (or extending) radially with respect to the reference point 131. In many embodiments, the prism structures 133 emanate or originate at the reference point 131.

FIG. 1 shows a structured surface element 130 having twelve linear prismatic structures 133 arranged radially with respect to the reference point 131. Since each prismatic structure 133 has two prismatic facets or sides that intersect to form an extended apex 132, the structured surface of element 130 has 24 such prismatic facets or sides. In many embodiments, each prismatic structure has an apex angle of 90 degrees. The structured surface element 130 can have any useful number of linear prismatic structures 133 arranged radially with respect to the reference point 131. In many embodiments, the structured surface element 130 has any useful number of linear prismatic structures 133 arranged symmetrically with respect to the reference point 131 or to a line or plane containing the reference point 131. In FIG. 1, each linear prismatic structure 133 has a prism apex 132 and these apices substantially intersect at the reference point 131. The apices may have any useful apex angle between 10 degrees and 170 degrees, or between 70 degrees and 110 degrees, or about 90 degrees.

The prismatic structures 133 include a reference plane 134 and a substantially linear prism apex 132. The reference plane 134 is perpendicular to the light emission axis $C_L$. As shown in FIG. 1, the reference place 134 can be parallel or substantially parallel to the linear apices 132. In some embodiments, the reference plane 134 is parallel or substantially parallel to the linear apices 132 and the optional reflective layer 120. When the reference plane 134 is parallel or substantially parallel to the linear apices 132, this structured surface 130 can be termed a "flat-spine" diverting element. This flat-spine diverting element can have any useful thickness (along the z-axis) and may be disposed on the reflective layer 120 or the substrate layer 115. The LED 110 can be separate from, or embedded within this flat-spine diverting element.

Figure 2:
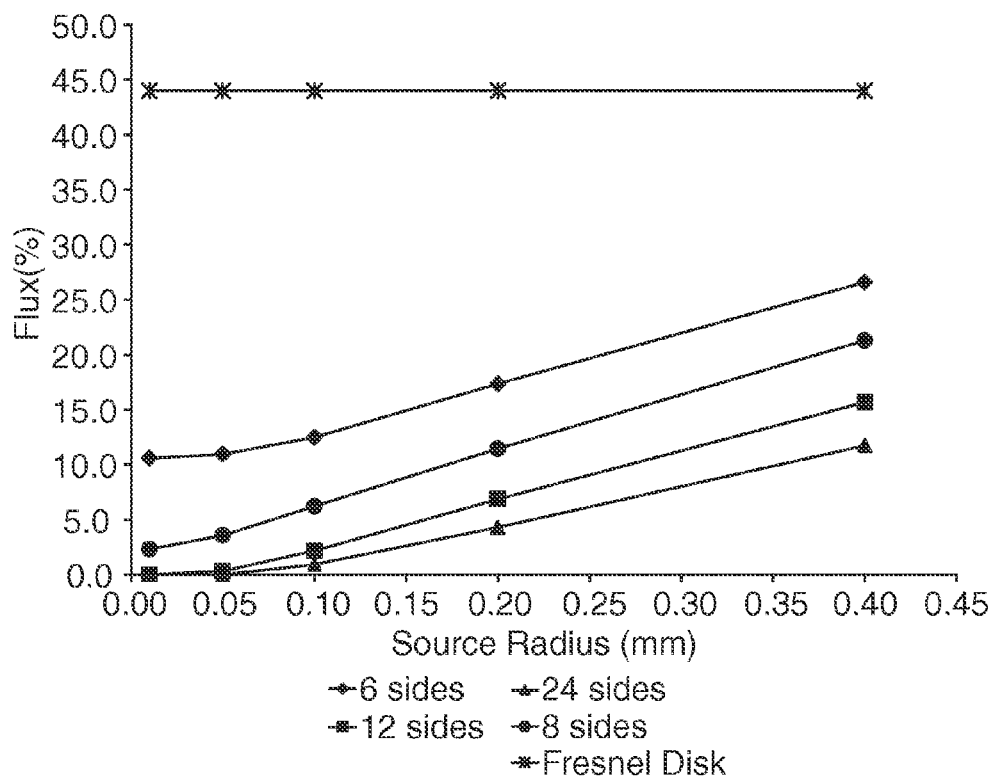
FIG. 2 is a light flux leakage plot of the optical assembly shown in FIG. 1.

FIG. 2 is a calculated light flux leakage plot of the optical assembly shown in FIG. 1. This plot shows how the number of linear prism structures affects the light flux leakage of the flat-spine diverting element. This flat-spine diverting element can be formed of acrylic having a refractive index of about 1.5 to 1.8, and light can be emitted from a circular lambertian source of zero thickness embedded in the acrylic 0.98 mm from the top of the structured surface of the diverting element and 0.02 mm from the planar reflective bottom surface. The calculated flux emitted through the prismatic surface can be plotted verses the source dimension for flat-spine diverting elements having six, eight, twelve, and twenty-four sides (i.e., three, four, six, and twelve linear prism structures respectively radiating from the reference point), and a Fresnel disk (i.e., simple flat surface with no prism structures). This flat-spine diverting element causes light to march out from the LED light source at the light emitting axis $C_L$ via total internal reflection by successive first and second reflections from adjacent first and second prismatic facets of the flat-spine diverting element. Thus, a bright center point is eliminated or mitigated as light exits the diverting element at a perimeter of the flat-spine diverting element.

The optional reflective layer 120 can be provided on a substrate 115. The reflective layer 120 directs at least some light emitted from the LED 110 back into the structured surface element 130. The reflective layer 120 can be specular or diffuse and formed of any useful material. The substrate 115 can be formed of any useful material. In some embodiments, the substrate 115 is formed of a metal, ceramic, or polymer. Conductors may be provided on different layers for carrying electrical current to and from the LED 110. For example, conductors may be provided on the substrate 115. The conductors may take the form of metallic traces, for example formed from copper.

LED light is emitted from the LED 110 over a wide range of angles. The structured surface element 130 described herein diverts and emits this LED light at the periphery of the diverting element. Light may be extracted from the periphery into air or into another optical body, or light may be extracted from the prismatic structures 133 by striking the first or second adjacent facets of such structures at angles that fail total internal reflection. The optical assembly may include features to scatter light, such as with a diffusely reflecting reflector 120, or scattering particles within the prism medium, or surface roughness on the prism surfaces. This LED assembly can be described as a light confinement LED assembly.

If the apices have an upward slope, relative to the reference surface, toward the periphery and away from the reference point 131, then the propagation angles of light are increasingly parallel to the reference plane 134 and or generally perpendicular to the light emission axis $C_L$ (along the z-axis). Such LED assemblies can be described as side-emitting LED assemblies.

The structured surface element 130 can be formed of any useful material. In many embodiments, the structured surface element 130 is a polymeric material, transparent to the light emitted by the LED 110. In some embodiments, the structured surface element 130 is formed from a polycarbonate, polyester, polyurethane, polyacrylate, and the like.

FIG. 3 is a perspective view of another illustrative optical assembly. The optical assembly 200 includes a light emitting diode (LED) 210 having a light emission axis $C_L$ extending along a z-axis, an optional reflective layer 220 situated adjacent the LED 210, and a structured surface element 230 disposed over the LED 210 and optional reflective layer 220. In many embodiments, the structured surface element 230 has a reference point 231 disposed along or substantially aligned with the light emission axis $C_L$. The structured surface element 230 has at least two, three, or at least four linear prism structures 233 arranged (or extending) radially with respect to the reference point 231. In many embodiments, the prism structures 233 emanate or originate at the reference point 231.

FIG. 3 shows a structured surface element 230 having twelve linear prismatic structures 233 arranged radially with respect to the reference point 231. Since each prismatic structure 233 has two prismatic facets or sides that intersect to form an extended apex 232, the structured surface of element 230 has 24 such prismatic facets or sides. The structured surface element 230 can have any useful number of linear prismatic structures 233 arranged radially with respect to the reference point 231. In many embodiments, the structured surface element 230 has any useful number of linear prismatic structures 233 arranged symmetrically with respect to the reference point 231 or a line or plane containing reference point 231. In many embodiments, each linear prismatic structure 233 has a prism apex 232 and these apices substantially intersect at the reference point 231.

The prismatic structures 233 include a reference plane 234 and a substantially linear apex 232. As shown in FIG. 3, the reference plane 234 is non-parallel or substantially non-parallel with the linear apices 232. In some embodiments, the reference plane 234 is parallel or substantially parallel with the optional reflective layer 220. In the illustrated embodiment, the linear apices 232 form a linear incline slope with respect to the reference plane 234 and are in a conical arrangement with respect to the light emission axis $C_L$. This structured surface element 230 can be termed a "sloped-spine" diverting element. This sloped-spine diverting element can have any useful thickness (along the z-axis) and may be disposed on the reflective layer 220 or the substrate layer 215. The LED 210 can be separate from, or embedded within this sloped-spine diverting element. The slope of the apices 232 relative to reference plane 234 can be selected according to the desired light emission pattern from the optical assembly. In many cases the slope will be adjusted to enhance or maximize side-emission, i.e., light emitted in directions that are substantially parallel to the x-y plane or substantially perpendicular to the light emission axis of the LED, and likewise the slope can be adjusted to diminish or minimize light emitted parallel to the light emission axis. Also, as explained further below in connection with curved prismatic structures, the slope can change continuously over the length of each prismatic structure. Preferably, the slope is in a range from 2 to 80 degrees, or 5 to 30 degrees, or about 15 degrees.

Figure 4:
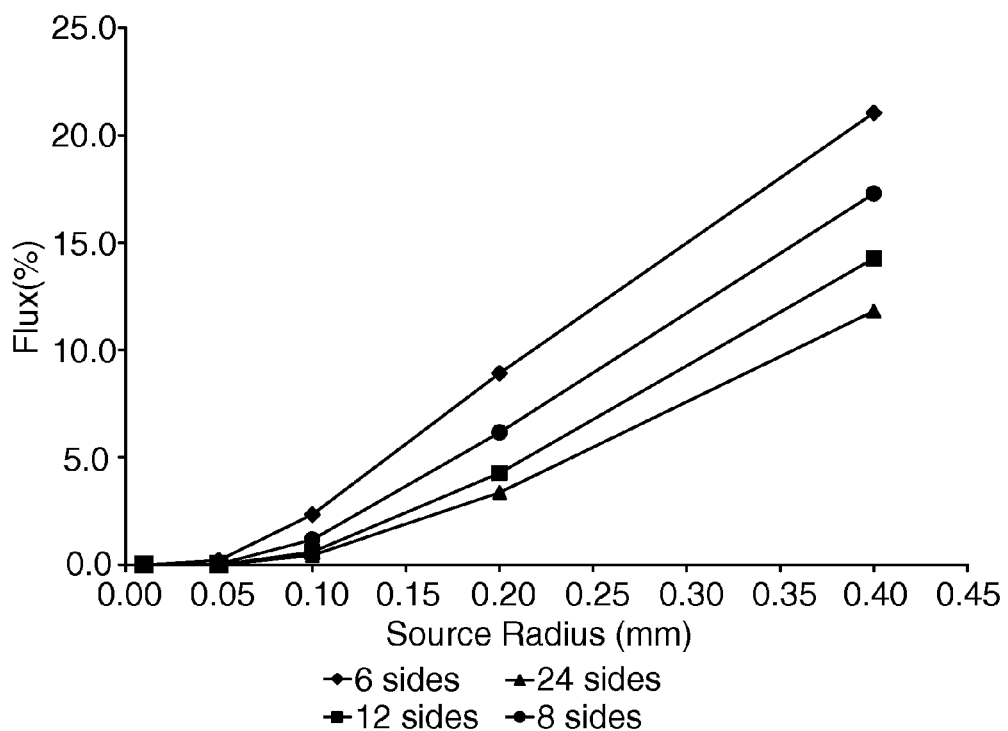
FIG. 4 is a light flux leakage plot of the optical assembly shown in FIG. 3.

FIG. 4 is a calculated light flux leakage plot of the optical assembly shown in FIG. 3. This plot shows how the number of linear prism structures affects the light flux leakage of the sloped-spine diverting element. This sloped-spine diverting element can be formed of acrylic (described above), and light can be emitted from a circular lambertian source embedded in the acrylic 0.98 mm from the top of the surface of the sloped-spine diverting element and 0.02 mm from the planar reflective bottom surface. For purposes of FIG. 4, the slope of the apices 232 was set to approximately 15 degrees. The calculated flux emitted through the prismatic surface is plotted verses the source dimension for this sloped-spine diverting elements having six, eight, twelve, and twenty-four sides, i.e., three, four, six, and twelve prismatic structures 233. This sloped-spine diverting element causes light to march out from the LED light source at the light emitting axis $C_L$ via total internal reflection by successive first and second reflections from adjacent first and second prismatic facets of the sloped-spine diverting element. Thus, a bright center point is eliminated or mitigated as light exits the diverting element at a perimeter of the diverting element.

FIG. 5 is a perspective view of another illustrative optical assembly. The optical assembly 300 includes a light emitting diode (LED) 310 having a light emission axis $C_L$ extending along a z-axis, an optional reflective layer 320 situated adjacent the LED 310, and a structured surface element 330 disposed over the LED 310 and optional reflective layer 320. In many embodiments, the structured surface element 330 has a reference point 331 disposed along or substantially aligned with the light emission axis $C_L$. The structured surface element 330 has at least two, three or at least four prism structures 333 arranged (or extending) radially with respect to the reference point 331. In many embodiments, the prism structures 333 emanate or originate at the reference point 331.

FIG. 5 shows a structured surface element 330 having twelve prismatic structures 333 arranged radially with respect to the reference point 331. Since each prismatic structure 333 has two prismatic facets or sides that intersect to form an extended curved apex 332, the structured surface of element 330 has 24 such prismatic facets or sides. The structured surface element 330 can have any useful number of prismatic structures 333 arranged radially with respect to the reference point 331. In many embodiments, the element 330 has any useful number of prismatic structures 333 arranged symmetrically with respect to the reference point 331 or a line or plane containing reference point 331. In many embodiments, each prismatic structure 333 has a prism apex 332 and these apices substantially intersect at the reference point 331.

The prismatic structures 333 include a reference plane 334 and a curved apex 332. As shown in FIG. 5, the reference plane 334 is non-parallel or substantially non-parallel with the apices 332. In some embodiments, the reference plane 334 is parallel or substantially parallel with the optional reflective layer 320. In the illustrated embodiment, the apices 332 form a curved slope with respect to the reference plane 334 and are inclined in a funnel arrangement relative to the light emitting axis $C_L$. This illustrated structured surface element 330 can be termed a "curved-spine" diverting element. This curved-spine diverting element can have any useful thickness (along the z-axis) and may be disposed on the reflective layer 320 or the substrate layer 315. The LED 310 can be separate from, or embedded within this curved-spine diverting element.

Figure 6:
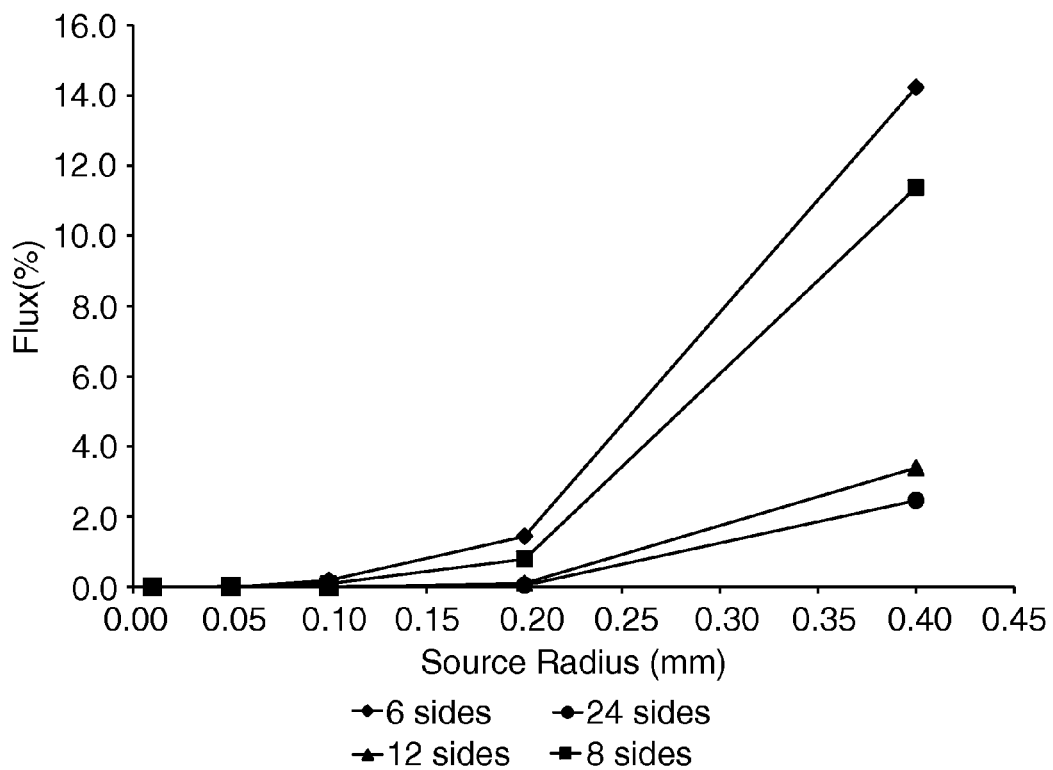
FIG. 6 is a light flux leakage plot of the optical assembly shown in FIG. 5.

FIG. 6 is a calculated light flux leakage plot of the optical assembly shown in FIG. 5. This plot shows how the number of curved prism structures affects the light flux leakage of the structured surface element. This structured surface element can be formed of acrylic (described above), and light can be emitted from a circular lambertian source embedded in the acrylic 0.98 mm from the top of the surface of the optical element and 0.02 mm from the planar reflective bottom surface. For purposes of FIG. 6, the curve of the prism apices 332 was approximately an elliptic shape of revolution where the semimajor and semiminor axes were 1 mm and 0.7 mm respectively and the axis of revolution was approximately 0.1 mm in from the origin. The calculated flux emitted through the prismatic surface is plotted verses the source dimension for curved-spine diverting elements having six, eight, twelve, and twenty-four sides, i.e., three, four, six, and twelve prismatic structures 333. This curved-spine diverting element causes light to march out from the LED light source at the light emitting axis $C_L$ via total internal reflection by successive first and second reflections from adjacent first and second prismatic facets of the curved-spine diverting element. Thus, a bright center point is eliminated or mitigated as light exits the diverting element at a perimeter of the diverting element.

Figure 7:
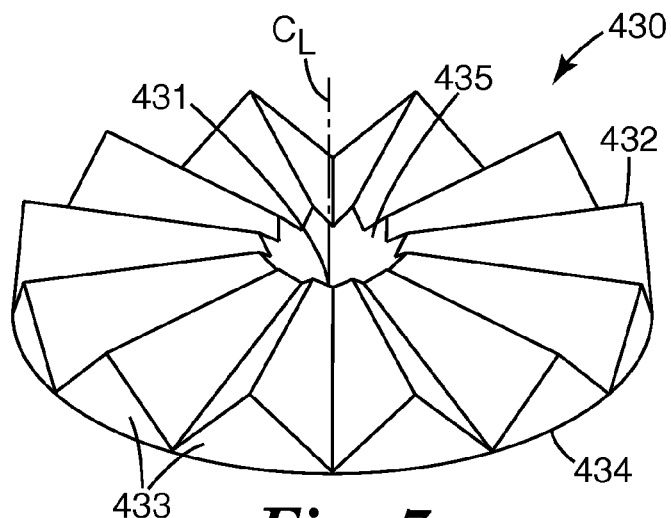
FIGS. 7-8 are perspective views of further illustrative optical assemblies.

FIG. 7 is a perspective view of a further illustrative structured surface element 430. The structured surface element 430 has a reference point 431 disposed along or substantially aligned with a light emission axis $C_L$. The structured surface element 430 includes a funnel-shaped recess 435 disposed at the reference point 431 and along the light emitting axis $C_L$ (along a z-axis). The funnel shaped recess 435 can be utilized in any of the embodiments described herein. In many embodiments, the funnel shaped recess 435 has a rotationally symmetric shape about the light emitting axis $C_L$.

The structured surface element has at least two, three, or at least four linear prism structures or sides 433 each having a prism apex 432 and a first end proximate the reference point 431. In the illustrated embodiment, the first ends of the prism apices are spaced apart from the reference point 431. The structured surface element 430 prism structures 433 are arranged symmetrically with respect to the reference point 431 or a line or plane containing reference point 431. In many embodiments, the prism structures 433 emanate or originate at the reference point 431 if extended into the funnel-shaped recess 435. FIG. 7 shows an optical element 430 having twelve linear prism structures 433 extending from the funnel-shaped recess 435.

The recess or funnel-shaped recess 435 can have a rotationally symmetric shape about the light emitting axis $C_L$ and/or reference point 431 and be disposed above and in registration with the LED (as described above). LED emitted light is totally internally reflected at the funnel shaped recess 435 surface and directed away from the light emitting axis $C_L$. The recess or funnel-shaped recess 435 includes a cusp at the reference point 431. In many embodiments, the recess or funnel-shaped recess 435 is formed within the upper surface of the structured surface element 430. The recess or funnel-shaped recess 435 curve can be calculated and revolved about the light emitting axis $C_L$ to form the funnel shape that confines substantially all LED emitted light to the structured surface element 430. In many embodiments, the funnel-shaped recess 435 has a rotationally symmetric shape about the light emitting axis $C_L$.

Figure 8:
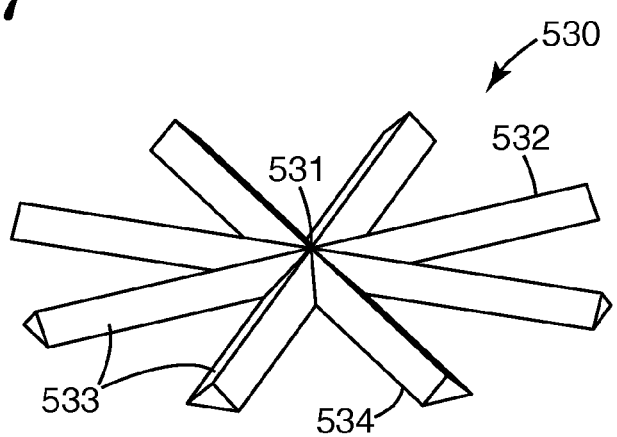

FIG. 8 is a perspective view of a further illustrative structured surface element 530. The structured surface element 530 includes a plurality of linear prism structures or sides 533 extending from the reference point 531. The reference point 531 can be disposed along the light emitting axis $C_L$ extending along a z-axis. The structured surface element 530 has at least two, three, or at least four linear prismatic structures 533 arranged (or extending) radially with respect to the reference point 531. The structured surface element 530 prism structures 533 are arranged symmetrically with respect to the reference point 531 or a line or plane containing reference point 531. In many embodiments, the prism structures 533 emanate or originate at the reference point 531. FIG. 8 shows a structured surface element 530 having eight linear prism structures 533 arranged radially with respect to the reference point 531. In many embodiments, each linear prismatic structure 533 has a prism apex 532 and these apices substantially intersect at the reference point 531.

Figure 9:
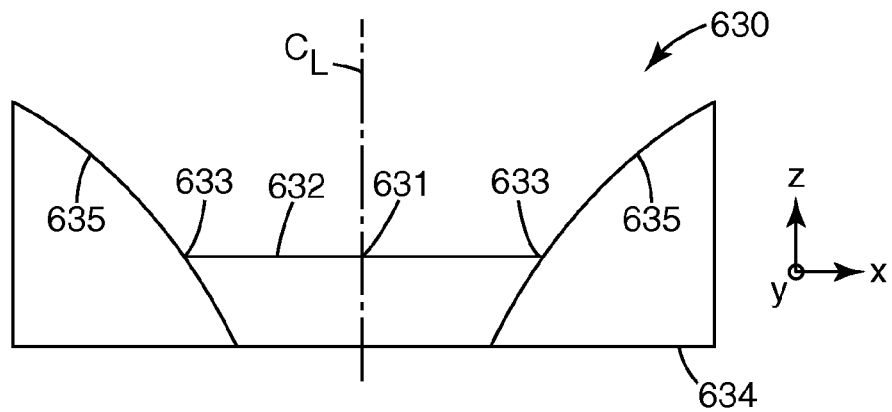
FIG. 9 is a schematic sectional view of a further illustrative optical assembly.

FIG. 9 is a schematic sectional view of another structured surface element 630. The structured surface element 630 has a reference point 631 disposed along or substantially aligned with a light emission axis $C_L$. The structured surface element 630 includes a funnel-shaped recess 635 disposed about an outer perimeter 633. While a flat-spine diverting element is shown in FIG. 9, this outer funnel shaped recess 635 can be utilized in any of the embodiments described herein. In many embodiments, the funnel shaped recess 635 has a rotationally symmetric shape about the light emitting axis $C_L$.

The structured surface element 630 has at least two, three, or at least four linear prism structures or sides each having a prism apex 632 and a first end proximate the reference point 631. The structured surface element 630 prism structures are arranged (or extend) radially with respect to the reference point 631. The structured surface element 630 can have any useful number of linear prismatic structures arranged radially with respect to the reference point 631, as described above.

The recess or funnel-shaped recess 635 can have a rotationally symmetric shape about the light emitting axis $C_L$ and/or reference point 631. LED emitted light is totally internally reflected at the funnel shaped recess 635 surface and directed away from the light emitting axis $C_L$. In many embodiments, the recess or funnel-shaped recess 635 is formed within the upper surface of the structured surface element 630 and extends upwardly and away from the outer perimeter 633 (as shown). The recess or funnel-shaped recess 635 curve can be calculated and revolved about the light emitting axis $C_L$ to form the funnel shape that confines substantially all LED emitted light to the structured surface element 630. In many embodiments, the funnel-shaped recess 635 has a rotationally symmetric shape about the light emitting axis $C_L$.

Figure 10:
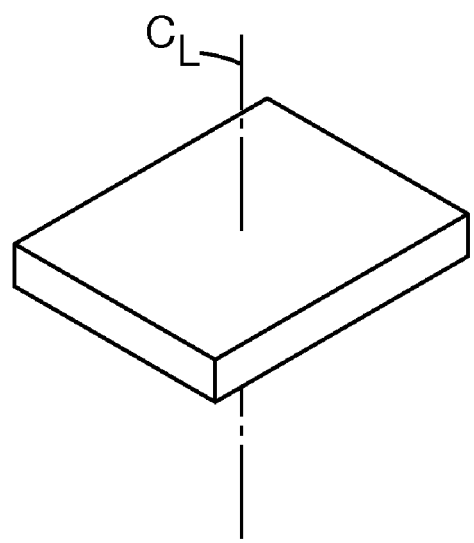
FIG. 10 is a schematic perspective view of an LED light source.

FIG. 10 is a schematic perspective view of an LED light source useful in any of the embodiments disclosed herein. This light source is an LED die. This LED die can include one or more electrical contact pads, e.g., in the center of the LED die (not shown). A light emitting axis $C_L$ is shown extending through the center of the LED die.

Figure 11:
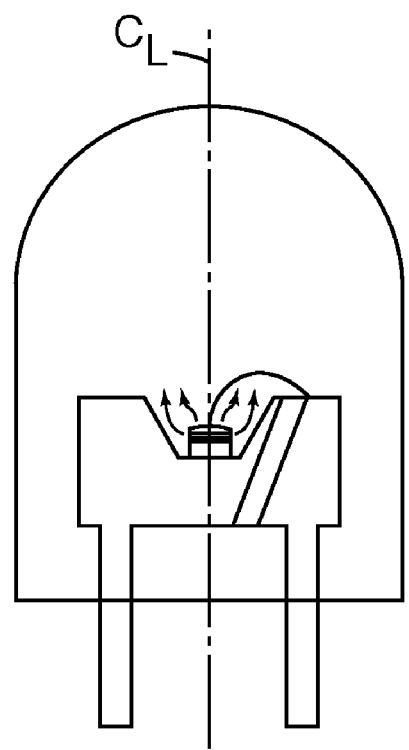
FIG. 11 is a schematic sectional view of an alternative LED light source.

FIG. 11 is a schematic sectional view of an alternative LED light source useful in any of the embodiments disclosed herein. This LED light source includes an encapsulant that surrounds the LED die, reflective cup, and wire bond. Such LED sources are commercially available from a number of manufacturers. A light emitting axis $C_L$ is shown extending through the center of the LED die and encapsulant.

In some embodiments, multiple structured surface elements can be combined to form arrays of structured surface elements. An array of LEDs can be combined with the array of structured surface elements, where each structured surface element has a plurality of prismatic structures arranged radially with respect to a reference point. Preferably, the reference point for each structured surface element is substantially aligned with a light emission axis of a corresponding LED. In some embodiments, the LEDs can be disposed adjacent a reflective layer. If the LEDs each include an LED die disposed within an encapsulant, the structured surface elements can be formed individually on each of the encapsulants. Alternatively, the structured surface elements can be formed in a continuous optical film that extends over some or all of the LEDs in the array.

The optical assemblies and arrays described herein can be utilized in a variety of flat illumination, display, or backlight applications where an optical display element is disposed above the structured surface element for emitting the light.

The optical assemblies and arrays described herein can be formed by any useful method. In some embodiments, these optical assemblies and arrays are molded. In some embodiments, these optical assemblies and arrays are formed on a web or film of any length.

The present invention should not be considered limited to the particular examples described herein, but rather should be understood to cover all aspects of the invention as fairly set out in the attached claims. Various modifications, equivalent processes, as well as numerous structures to which the present invention can be applicable will be readily apparent to those of skill in the art to which the present invention is directed upon review of the instant specification.

What is claimed is:

1. An optical assembly, comprising:
   a light emitting diode (LED) having a light emission axis;
   a structured surface comprising a plurality of linear prismatic structures arranged radially with respect to a reference point, the structured surface disposed relative to the LED such that the reference point is substantially aligned with the light emission axis; and
   non-structured portions between each of the one linear prismatic structures such that the linear prismatic structures are at least partially discontiguous around the reference point,
   wherein each of prismatic structures has a substantially linear prism apex,
   wherein each prism apex is parallel to a reference plane, the reference plane being perpendicular to the light emission axis.

2. The optical assembly of claim 1, wherein the prism apices are inclined in a conical arrangement relative to the light emission axis.

3. The optical assembly of claim 1, wherein each of the prismatic structures has a prism apex, and the prism apices substantially intersect at the reference point.

4. The optical assembly of claim 1, further comprising:
   a reflective layer positioned to receive at least some LED light reflected by the structured surface.

5. The optical assembly of claim 1, wherein the prismatic structures divert at least some light from the LED by total internal reflection.

6. The optical assembly of claim 1, wherein a given prismatic structure diverts at least some light from the LED by successive first and second reflections from adjacent first and second prismatic facets respectively.

7. An array of optical assemblies according to claim 1.

8. The array of claim 7, further comprising:
   a reflective layer disposed adjacent the LEDs.

9. The array of claim 7, wherein the prismatic structures are formed on an optical film that extends over at least some of the LEDs.

10. A backlight comprising the array of claim 7.

11. A backlight comprising the optical assembly of claim 1.

12. The optical assembly of claim 1, wherein the apex angle of the prismatic structures is 90 degrees.

13. The optical assembly of claim 1, wherein the non-structured portions comprise planar portions.

14. The optical assembly of claim 1, wherein the linear prismatic structures are arranged symmetrically around the reference point.

15. An optical assembly, comprising:
   a light emitting diode (LED) having a light emission axis;
   a structured surface comprising a plurality of linear prismatic structures arranged radially with respect to a reference point, the structured surface disposed relative to the LED such that the reference point is substantially aligned with the light emission axis; and
   non-structured portions between each of the linear prismatic structures such that the linear prismatic structures are at least partially discontiguous around the reference point,
   wherein each of the prismatic structures has a curved prism apex, and
   wherein the prism apices are inclined in a funnel arrangement relative to the light emission axis.

16. An optical assembly, comprising:
   a light emitting diode (LED) having a light emission axis;
   a structured surface comprising a plurality of linear prismatic structures arranged radially with respect to a reference point, the structured surface disposed relative to the LED such that the reference point is substantially aligned with the light emission axis; and non-structured portions between each of the linear prismatic structures such that the linear prismatic structures are at least partially discontiguous around the reference point, wherein each of the prismatic structures has a prism apex having a first end proximate the reference point, the first ends of the prism apices being spaced apart from the reference point, and wherein the structured surface also includes a funnel-shaped recess at the reference point, the first ends of the prism apices being arranged around the recess.

17. An optical assembly, comprising:

a light emitting diode (LED) having a light emission axis;

a structured surface comprising a plurality of linear prismatic structures arranged radially with respect to a reference point, the structured surface disposed relative to the LED such that the reference point is substantially aligned with the light emission axis; and non-structured portions between each of the linear prismatic structures such that the linear prismatic structures are at least partially discontiguous around the reference point, wherein the LED includes an LED die disposed within an encapsulant, and wherein the structured surface is disposed on the encapsulant.

18. The optical assembly of claim 17, wherein the structured surface is formed in an outer surface of the encapsulant.

19. The optical assembly of claim 17, wherein the structured surface is formed in a diverting element and is disposed on the encapsulant.

20. An optical assembly, comprising:

a light emitting diode (LED) having a light emission axis;

a structured surface comprising a plurality of linear prismatic structures arranged radially with respect to a reference point, the structured surface disposed relative to the LED such that the reference point is substantially aligned with the light emission axis; and non-structured portions between each of the linear prismatic structures such that the linear prismatic structures are at least partially discontiguous around the reference point, wherein the structured surface includes a funnel-shaped recess having a rotationally symmetric shape about the light emission axis.

* * * * *